(12) United States Patent
Miller, Jr. et al.

(10) Patent No.: US 7,521,312 B2
(45) Date of Patent: Apr. 21, 2009

(54) METHOD AND SYSTEM FOR CREATING SELF-ALIGNED TWIN WELLS WITH CO-PLANAR SURFACES IN A SEMICONDUCTOR DEVICE

(75) Inventors: Gayle W. Miller, Jr., Colorado Springs, CO (US); Bryan D. Sendelweck, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/650,164

(22) Filed: Jan. 5, 2007

(65) Prior Publication Data

US 2008/0166862 A1 Jul. 10, 2008

(51) Int. Cl.
*H01L 21/8238* (2006.01)
(52) U.S. Cl. .................. 438/228; 438/798; 438/763; 438/527; 438/224; 438/551; 257/E27.067; 257/E21.63; 257/E21.644; 430/312
(58) Field of Classification Search .................. 438/798, 438/763, 527, 228, 213, 224, 551, 553; 257/E21.63, 257/E21.644, E27.067; 430/312
See application file for complete search history.

(56) References Cited

U.S. PATENT DOCUMENTS

| 4,599,789 A | 7/1986 | Gasner |
| 4,889,825 A | 12/1989 | Parrillo |
| 4,929,565 A | 5/1990 | Parrillo |
| 5,130,271 A * | 7/1992 | Migita .................. 438/527 |
| 5,670,395 A * | 9/1997 | Pan .................... 438/451 |
| 6,133,081 A | 10/2000 | Kim |
| 6,211,002 B1 | 4/2001 | Wu |
| 6,348,371 B1 | 2/2002 | Huang et al. |

* cited by examiner

*Primary Examiner*—Matthew S. Smith
*Assistant Examiner*—Julio J. Maldonado
(74) *Attorney, Agent, or Firm*—Schwegman, Lundberg & Woessner, P.A.

(57) ABSTRACT

A method and system for providing a twin well in a semiconductor device is described. The method and system include providing at least one interference layer and providing a first mask that covers a first portion of the semiconductor device and uncovers a second portion of the semiconductor device. The first and second portions of the semiconductor device are adjacent. The method and system also include implanting a first well in the second portion of the semiconductor device after the first mask is provided. The method and system also include providing a second mask. The interference layer(s) are configured such that energy during a blanket exposure develops the second mask that uncovers the first portion and covers the second portion of the semiconductor device. The method and system also include implanting a second well in the first portion of the semiconductor device after the second mask is provided.

19 Claims, 9 Drawing Sheets

US 7,521,312 B2

METHOD AND SYSTEM FOR CREATING SELF-ALIGNED TWIN WELLS WITH CO-PLANAR SURFACES IN A SEMICONDUCTOR DEVICE

FIELD OF THE INVENTION

The present invention relates to semiconductor devices, and more particularly to a method and system for providing a self-aligned twin well having a co-planar surface in a semiconductor device.

BACKGROUND OF THE INVENTION

Certain semiconductor devices include twin wells. A twin well includes a P well and an adjacent N-well. FIG. 1 depicts a conventional method 10 for providing a conventional twin well semiconductor device. The portion of the conventional twin well semiconductor device in which the P-well is to be formed is masked, via step 12. Step 12 includes forming a pad oxide over the surface of the wafer for the conventional twin well semiconductor device. Step 12 also includes depositing a nitride layer on the pad oxide over the surface of the wafer and providing a photoresist mask covering regions which are not to be implanted during formation of an N-well. Step 12 further includes removing the exposed portion of the nitride layer in regions in which the N-well is to be implanted. Consequently, the pad oxide is exposed in the regions in which the N-well is to be implanted, while the remaining nitride covers regions in which the P-well is to be formed. The photoresist mask may also be removed in step 12. The N-well is implanted, via step 14. Step 14 thus includes implanting with phosphorus, arsenic or another N-type dopant. The silicon nitride layer is sufficiently thick to prevent the N-type dopant from passing through the nitride in regions in which the P-well is to be formed. In addition, a photoresist mask, which is virtually congruent to the remaining nitride underneath, may optionally be retained as present in step 12 and used as mask in conjunction with the remaining nitride. Consequently, step 14 allows the N-well to be provided.

After implantation of the N-well, a LOCOS oxide is grown typically using a high temperature oxidizing ambient, via step 16. Prior to growing the LOCOS oxide, remaining photoresist is removed. The remaining nitride precludes the LOCOS oxide from being grown underneath, in regions in which the P-well is to be formed. The remaining nitride is then removed typically using a hot phosphoric etch bath, via step 18. A P-well is implanted typically using boron or another P-type dopant, via step 20. Because of the presence of the LOCOS oxide, the P-type dopant does not penetrate the N-well. The LOCOS oxide is then removed and the P-type implant activated, via step 22.

FIG. 2 depicts a conventional twin well semiconductor device 50. For clarity, the conventional semiconductor device 50 is not drawn to scale. The semiconductor device 50 is fabricated using the conventional method 10. The conventional semiconductor device 50 includes an N-well 52 and a P-well 56. Because the conventional method 10 is used, the N-well 52 and the P-well 56 are adjacent.

Although the method 10 can provide the conventional semiconductor device 50, one of ordinary skill in the art will readily recognize that the conventional semiconductor device 50 has serious drawbacks. In particular, the surfaces of the N-well 52 and P-well 56 are not coplanar. A step 60 exists between the surfaces of the N-well 52 and P-well 56. The step 60 adversely affects subsequent processing. For example, the step 60 may elevate electric fields and are associated with failures and defects, such as dielectric failure of a gate oxide that passes over a step. The step 60 may also cause out-of-focus conditions, which degrades imaging and reduces control over the properties of the conventional semiconductor device 50. The step 60 may also reduce the current carrying capacity of conductors which pass over the step 60 and reduce the mobility of charge carriers (electrons and/or holes) passing in the vicinity of the step 60. In addition, the step 60 may reduce the process window for subsequent chemical mechanical polishing (CMP). Moreover, the presence of the step 60 can result in the formation of stringers or unwanted pockets of material adjacent to them.

Accordingly, what is needed is a method and system for providing an improved twin well device. The present invention addresses such a need.

BRIEF SUMMARY OF THE INVENTION

The present invention provides a method and system for providing a twin well in a semiconductor device. The method and system comprise providing at least one interference layer and providing a first mask that covers a first portion of the semiconductor device and uncovers a second portion of the semiconductor device. The second portion of the semiconductor device is adjacent to the first portion. The method and system also comprise implanting a first well in the second portion of the semiconductor device after the first mask is provided. The method and system also comprise providing a second mask. The at least one interference layer is configured such that energy during a blanket exposure develops the second mask that uncovers the first portion of the semiconductor device and covers the second portion of the semiconductor device. The method and system also comprise implanting a second well in the first portion of the semiconductor device after the second mask is provided.

According to the method and system disclosed herein, the present invention provides a twin-well device having self-aligned N and P wells that have co-planar surfaces without complicating processing or rendering fabrication substantially more expensive.

DETAILED DESCRIPTION OF THE INVENTION

The present invention relates to semiconductor devices. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for providing a twin well in a semiconductor device. The method and system comprise providing at least one interference layer and providing a first mask that covers a first portion of the semiconductor device and uncovers a second portion of the semiconductor device. The second portion of the semiconductor device is adjacent to the first portion. The method and system also comprise implanting a first well in the second portion of the semiconductor device after the first mask is provided. The method and system also comprise providing a second mask. Then at least one interference layer is configured such that energy during a blanket exposure develops the second mask that uncovers the first portion of the semiconductor device and covers the second portion of the semiconductor device. The method and system also comprise implanting a second well in the first portion of the semiconductor device after the second mask is provided.

The present invention will be described in terms of a particular method having certain steps. However, one of ordinary skill in the art will readily recognize that the method in accordance with the present invention can include other and/or different steps not inconsistent with the present invention. Moreover, the present invention is described in the context of forming a particular number of well(s) in a device. One of ordinary skill in the art will, however, readily recognize that the present invention can be used in forming another number of wells.

Figure 1:
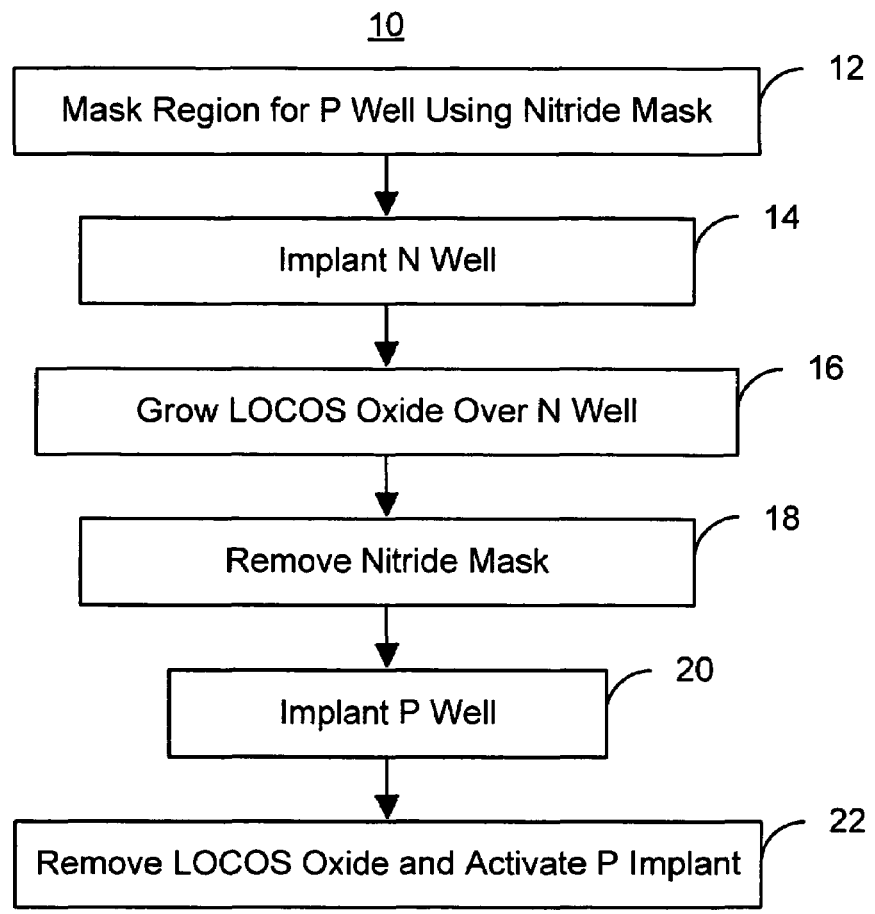
FIG. 1 is a diagram of a conventional method for forming a twin well device.
Figure 2:
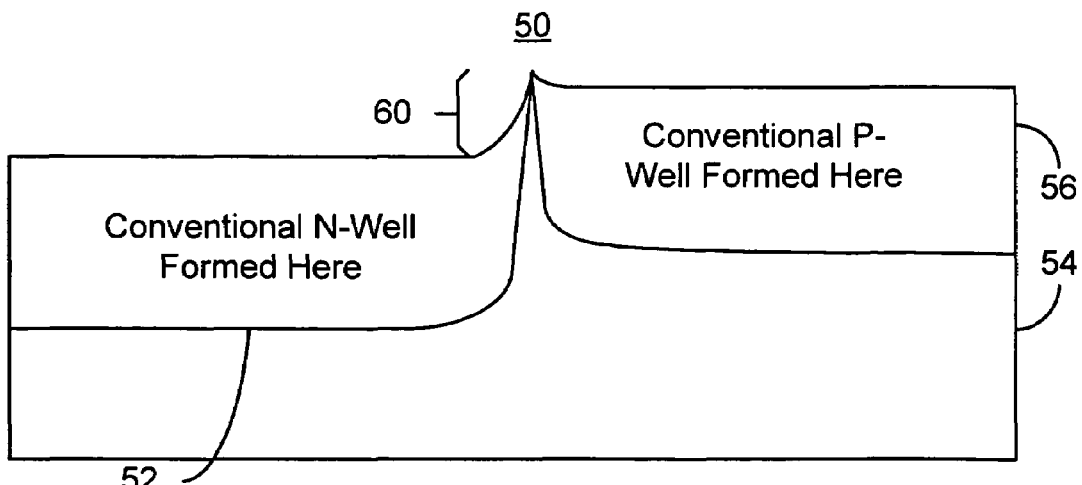
FIG. 2 is a diagram depicting a conventional twin well device.
Figure 3:
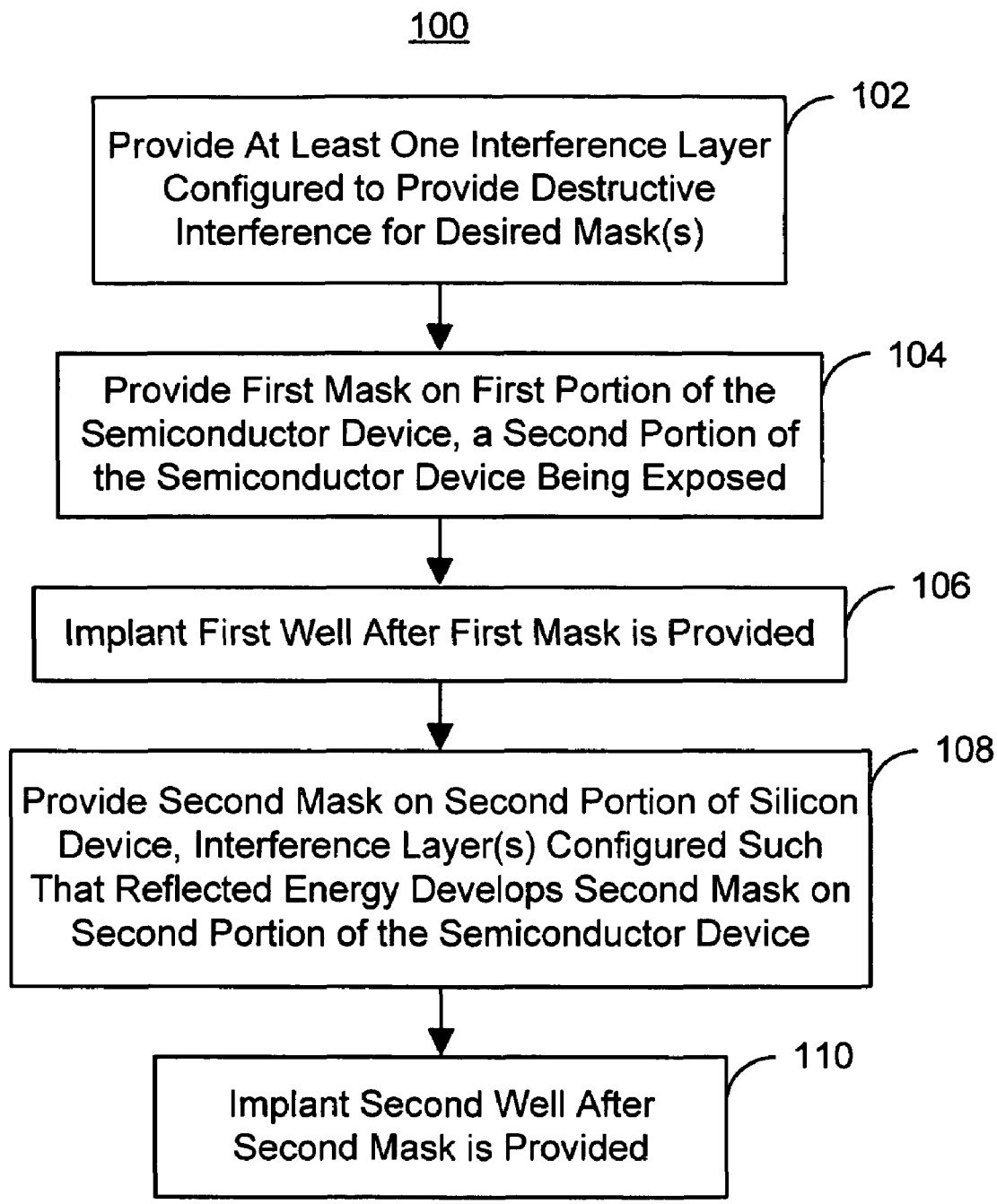
FIG. 3 is a flow chart of a one embodiment of a method in accordance with the present invention for forming a twin well device having coplanar surfaces.

FIG. 3 is a flow chart of a one embodiment of a method 100 in accordance with the present invention for forming a twin well device having coplanar surfaces. The method 100 is described in the context of forming a single twin well having an N-well and a P-well. However, one of ordinary skill in the art will readily recognize that the method 100 is generally extended to forming multiple twin wells on a silicon wafer. Furthermore, only certain steps are described in the method 100. Additional steps may also be included.

Interference layer(s) are provided, via step 102. Step 102 may thus include depositing one or more layers such as pad oxides, silicon dioxide, silicon oxynitride, reflective and/or BARC layers. The interference layers are configured such that energy incident on the photoresist layers, in steps 104 and 108 described below, form masks that allow for self-aligned twin wells. A first mask is provided on the semiconductor device, via step 104. The first mask covers a first portion of the semiconductor device and uncovers a second portion of the semiconductor device. One well is to be formed in the first portion of the device, while a second well is formed in the second portion of the device. For example, the N-well of the twin well device may be formed in the first portion of the semiconductor device and the P-well of the twin well may be formed in the second portion of the semiconductor device. Consequently, the first and second portions of the semiconductor device are adjacent. Step 104 may include providing a photoresist layer and developing the photoresist layer using an opaque mask.

Using a first dopant, a first well is implanted in the second portion of the semiconductor device after formation of the first mask, via step 106. Because of the first portion of the device is masked, the first well resides in the second portion of the device. A second mask is provided, via step 108. The second mask covers the second portion of the semiconductor device and uncovers the first portion of the semiconductor device. The interference layer(s) are configured such that a blanket exposure develops the second mask covering only the desired region. Thus, the second mask is self-aligned to the second portion using the blanket interference layers.

Using a second dopant, a second well is implanted in the first portion of the semiconductor device, via step 110. Because of the presence of the mask, the second well resides in the first portion of the semiconductor device. In addition, the second well has an edge that is substantially at the edge of the mask. Thus, self-aligned N-wells and P-wells for the twin well semiconductor device are formed. Processing of the semiconductor device may then be completed.

Using the method 100 a self-aligned twin well device is formed. Because the second-mask is self-aligned to the first mask, the second mask can be formed using a blanket exposure. Because the first and second masks are self-aligned, the first and second wells are adjacent and self aligned. The rigorous alignment of masks to provide the twin wells is accomplished relatively simply using the interference layer (s). Furthermore, the surfaces of the first and second wells are coplanar, and therefore, free of steps. Consequently, subsequent processing is greatly facilitated. This is achieved relatively simply, without requiring expensive additional masks and processing steps.

Figure 4:
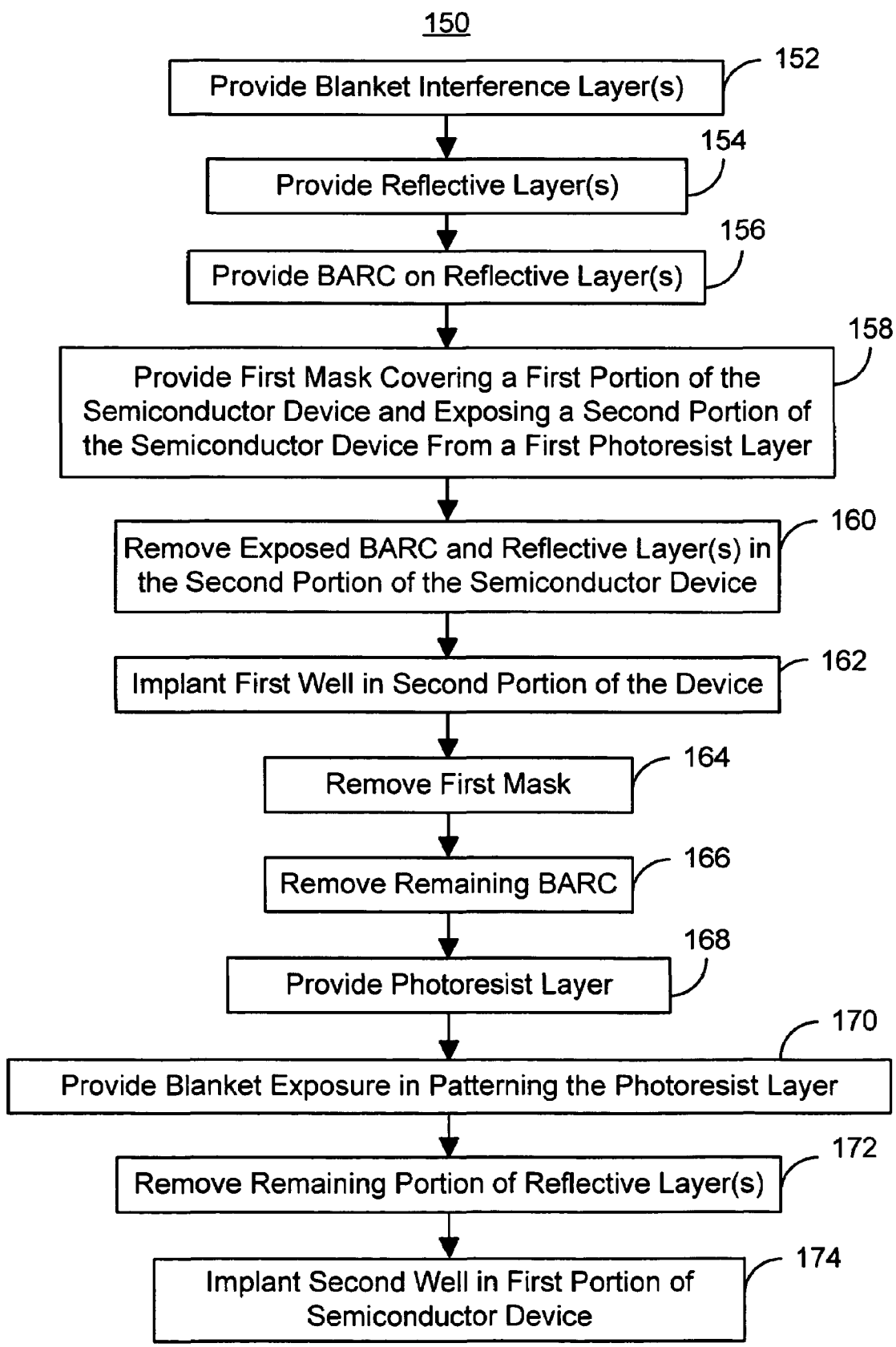
FIG. 4 is a flow chart of another embodiment of a method in accordance with the present invention for forming a twin well device having coplanar surfaces.

FIG. 4 is a flow chart of another, preferred, embodiment of a method 150 in accordance with the present invention for forming a twin well device having coplanar surfaces. FIGS. 5-16 depict one embodiment of twin well device 200 in accordance with the present invention during fabrication using the method 150. Thus, the method 150 is described in the context of the semiconductor device 200. For clarity, the semiconductor device 200 depicted in FIGS. 5-16 is not drawn to scale.

Figure 5:
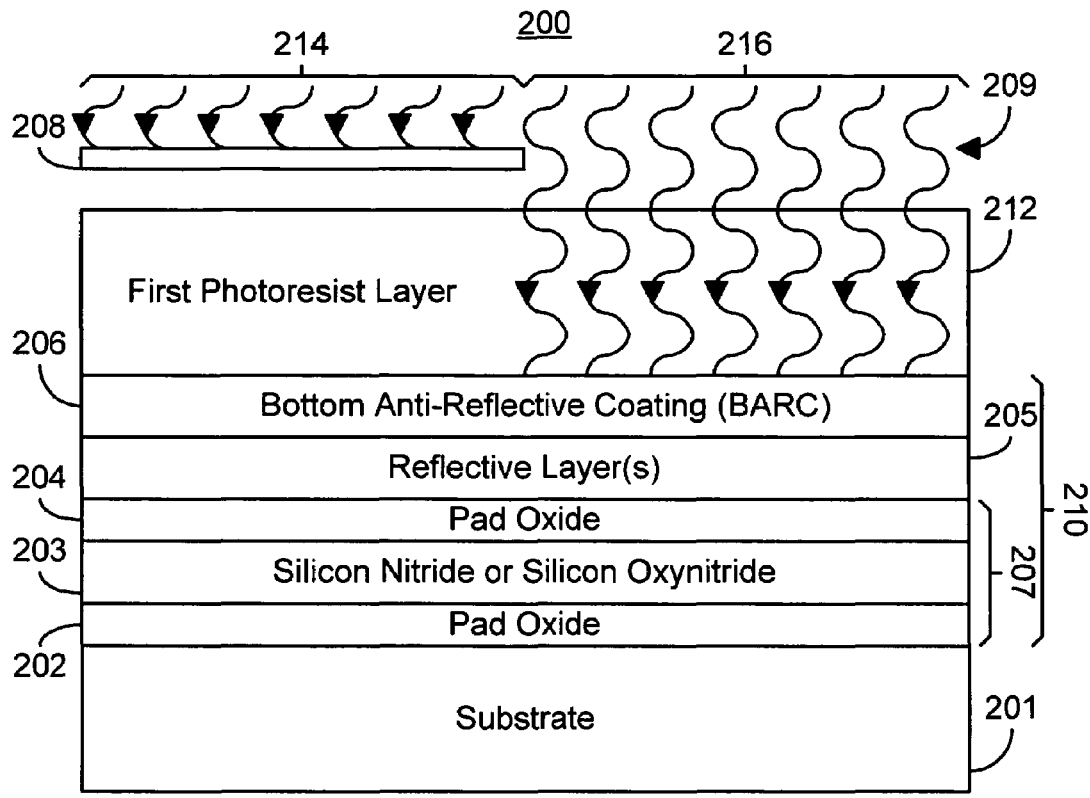
FIGS. 5-16 depict one embodiment of twin well device in accordance with the present invention during fabrication.
Figure 6:
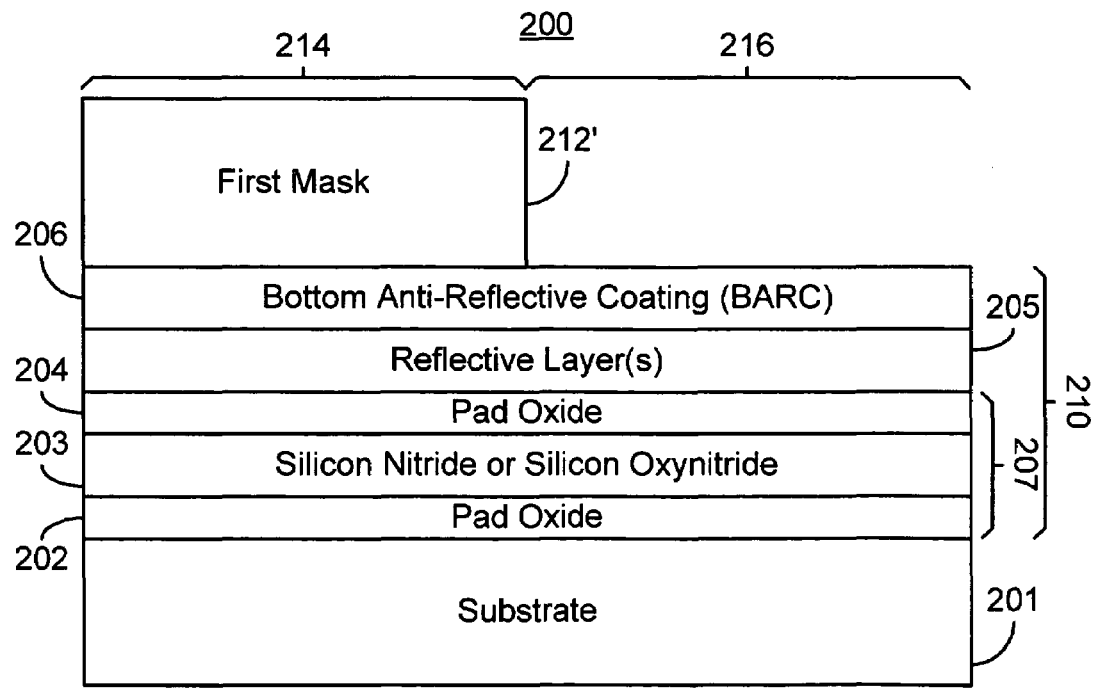

Referring to FIGS. 4 and 5-16, blanket interference layer (s) are provided on the semiconductor device, via step 152. The blanket interference layer(s) reside across the regions of the semiconductor device where both wells are to be formed. Step 152 is preferably performed by forming a first pad oxide, a second pad oxide, and a silicon nitride or silicon oxynitride layer between the first and second pad oxides. However, in another embodiment a single silicon nitride or silicon oxynitride layer may be used. The blanket interference layer is preferably configured to provide destructive interference of light used in exposing the second photoresist layer (described below) in regions above the blanket oxide. Thus, in a preferred embodiment, the blanket interference layer is configured to provide a path difference of half a characteristic wavelength for light reflected after passing through the blanket interference layer(s). Thus, light reflected from below the blanket interference layer(s) will be one hundred and eighty degrees out of phase with light incident on the blanket interference layer(s). Thus, in one embodiment, the combined thickness of the blanket interference layer(s) is one-fourth of the characteristic wavelength. Reflective layer(s) are provided on the blanket interference layers, via step 154. In one embodiment, the reflective layer(s) may be a single layer polysilicon. In other embodiments, other materials and/or additional layers might be used. In one embodiment, a bottom antireflective coating (BARC) including at least one layer is optionally provided on the reflective layer(s) to enhance the lithography of the first masking layer, via step 156. Consequently, the method and system are described in the context of a BARC layer. However, in at least some embodiments, the BARC layer may be omitted substantially without adversely affecting the operation of the method and system described herein. The reflective layer(s) and the blanket interference layer(s) may be considered to form an interference layer which is used to self-align the first and second masks. A first mask that covers a first portion of the semiconductor device and uncovers a second portion of the semiconductor device is provided on the BARC, via step 158. One well is to be formed in the first portion of the device, while a second well is formed in the second portion of the device. For example, the N-well of the twin well device may be formed in the first portion of the semiconductor device and the P-well of the twin well may be formed in the second portion of the semiconductor device. Consequently, the first and second portions of the semiconductor device are adjacent. Step 158 preferably includes providing a first layer of photoresist, providing a photo mask having opaque features above the first portion and exposing the second portion of the semiconductor device. Step 158 also preferably includes developing the first photoresist layer using the photo mask. FIG. 5 depicts the semiconductor device 200 during step 158. The blanket interference layer 207 is formed on substrate 201. Also shown are a reflective layer 205, a BARC 206 and a photoresist layer 212. The blanket interference layer 207 shown includes a first pad oxide 202, a silicon nitride or silicon oxynitride layer 203, and a second pad oxide 204. Moreover, the blanket interference layer 207, the reflective layer 205, and the BARC 206 (if used) together may be considered to form the interference layer 210. The interference layer 210, as a whole, is configured to reduce the reflectivity from the device 200. Again, note that for clarity, the figures are not drawn to scale. For example, in some embodiments, the pad oxide 202 is at least fifty and not more than one thousand Angstroms thick; the silicon nitride or silicon oxynitride layer 203 is at least one hundred and not more than two thousand Angstroms thick; the pad oxide 204 is at least twenty-five and not more than two hundred Angstroms thick; the BARC 206 is typically at least three hundred and not more than two thousand Angstroms thick; and the first photoresist layer 212 is typically at least three thousand and not more than fifty thousand Angstroms thick. However, the thicknesses may vary depending upon the wavelength of light used and other processing variables such as implant species and energy. Also depicted in FIG. 5 are photo mask 208 and incident light 209. Thus, the photo mask 208 covers a first portion 214 of the semiconductor device and uncovers a second portion 216 of the semiconductor device. Consequently, the photoresist layer 212 will be developed and the desired portions may be removed. FIG. 6 depicts the semiconductor device 200 after step 158 is completed. Thus, the first mask 212' has been formed from the photoresist layer. The first mask 212' covers the first portion 214 of the semiconductor device 200 and exposes the second portion 216 of the semiconductor device 200.

Figure 7:
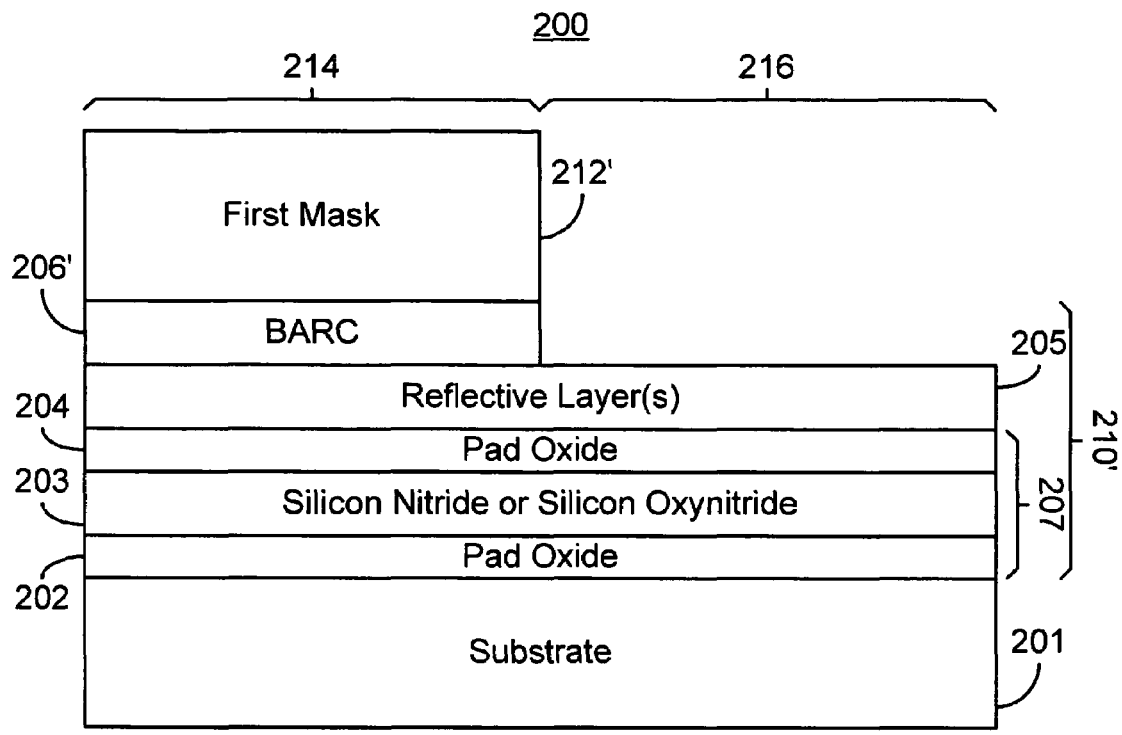
Figure 8:
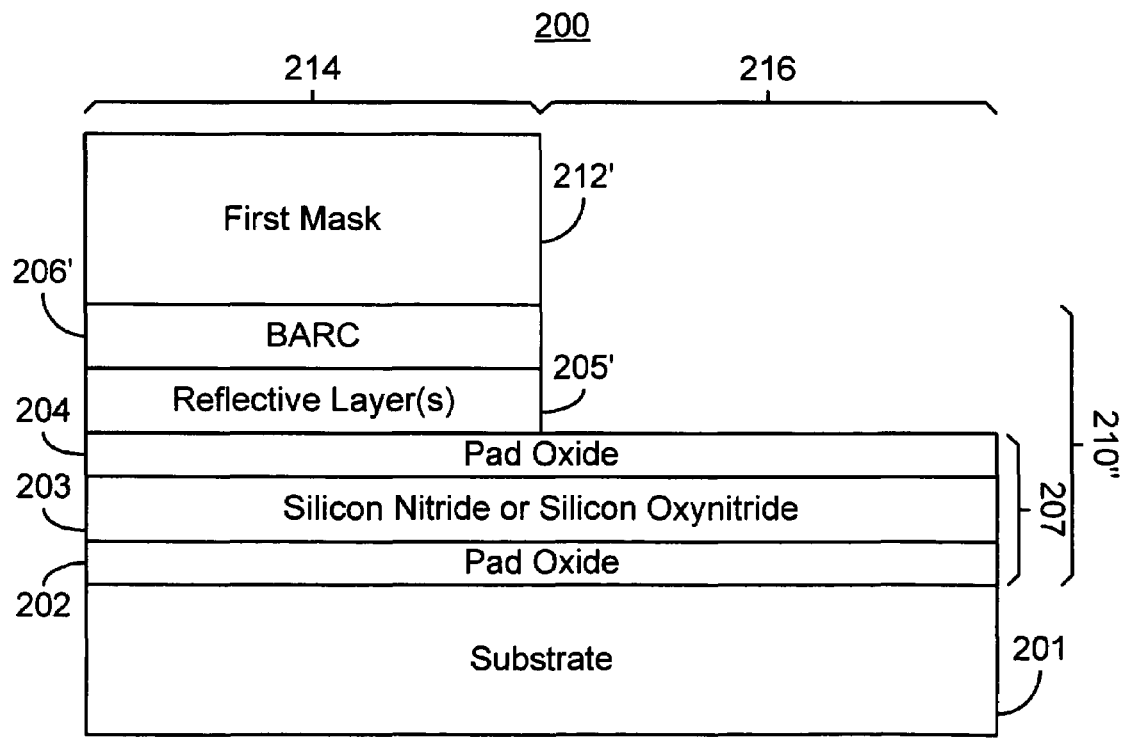

The layers above the pad oxide 204 are removed, via step 160. Step 160 preferably includes performing a dry plasma etch to remove the exposed portion of the BARC 206 (if used) and the underlying reflective layer(s) 205. FIG. 7 depicts the semiconductor device 200 after the mask exposed portion of the BARC 206 has been removed. Consequently, the interference layer(s) 210' include the BARC 206' residing only in the first portion of the semiconductor device 200 remains. FIG. 8 depicts the semiconductor device 200 after step 160 is completed. A portion of the reflective layer(s) 205 has been removed. Consequently, the interference layer(s) 210" include the reflective layer(s) 205' only in the first portion 214 of the semiconductor device 200.

Figure 9:
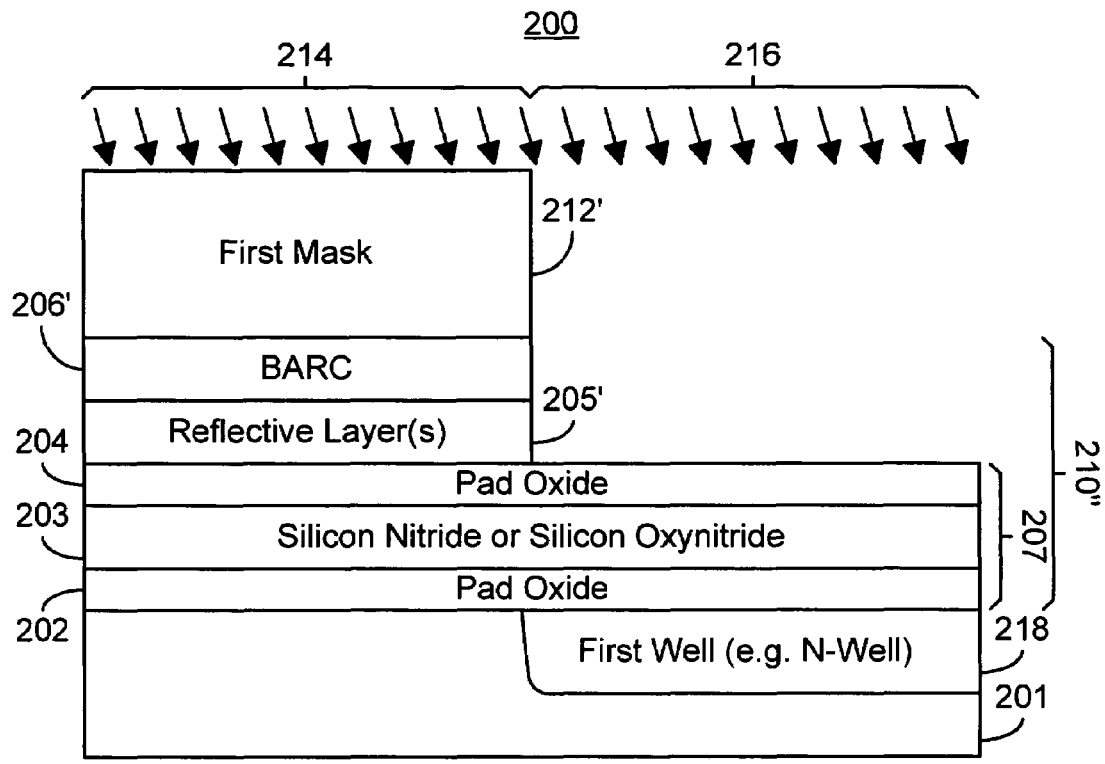

A first well is implanted using a first dopant type, via step 162. FIG. 9 depicts the semiconductor device 200 during step 162. Consequently, a first well 218 is shown as it is formed. Because the first portion 214 of the semiconductor device 200 is covered by the first mask 212', the implant only penetrates the substrate 201 in the second portion 216 of the device. Thus, the first well 218 resides in the second portion 216 of the semiconductor device 200.

Figure 10:
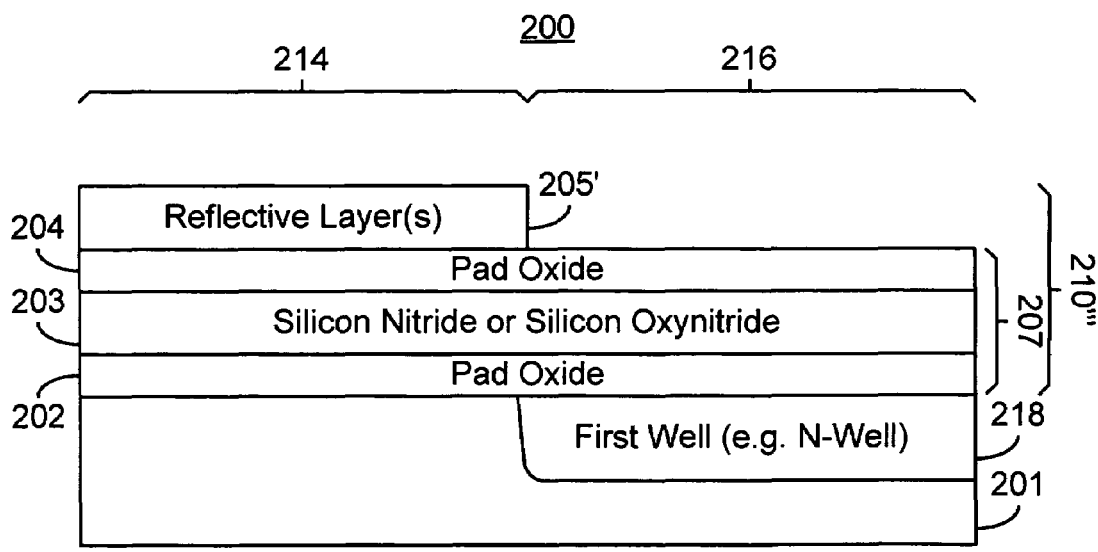
Figure 11:
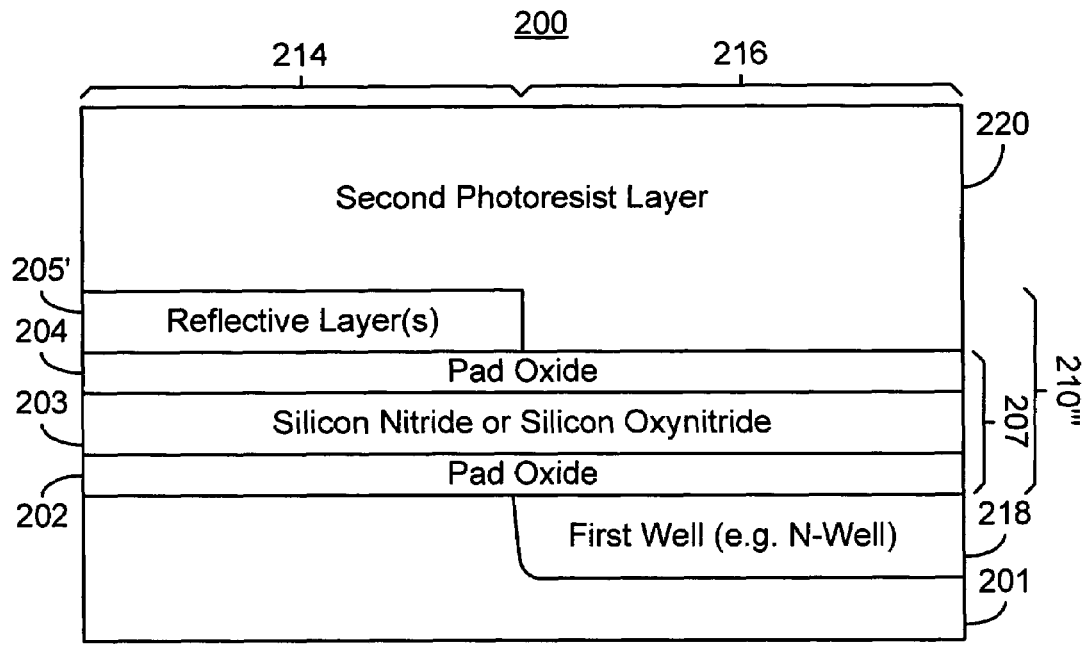

The first mask 212' is removed, via step 164. In addition, the remaining BARC 206' in the first portion 214 of the semiconductor device 200 is removed, via step 166. Thus, the underlying reflective layer(s) 205' is exposed. FIG. 10 depicts the semiconductor device 200 after step 166 is completed. Consequently, the blanket interference layer(s) 210''' no longer include the BARC 206'. A second photoresist layer is provided on the semiconductor device 200, via step 168. The second photoresist layer preferably covers the first portion 214 and the second portion 216 of the semiconductor device 200. FIG. 11 depicts the semiconductor device 200 after step 168 is completed. The second photoresist layer 220 has been formed over both the first portion 214 and the second portion 216 of the semiconductor device 200.

The second photoresist layer 214 patterned, including using a blanket exposure, to provide a second mask, via step 170. The blanket exposure is performed using light characterized by a characteristic wavelength. Note that as used herein, the term light is not limited to visible light but might, for example, include ultraviolet light. The light used preferably has substantially one wavelength, the characteristic wavelength. The underlying interference layer 210'''' is configured such that only a portion of the photoresist layer 220 on the first portion 214 of the semiconductor device 200 is developed. Through step 170, a portion of the second photoresist layer 220 on the first portion 214 of the semiconductor device is removed.

Figure 12:
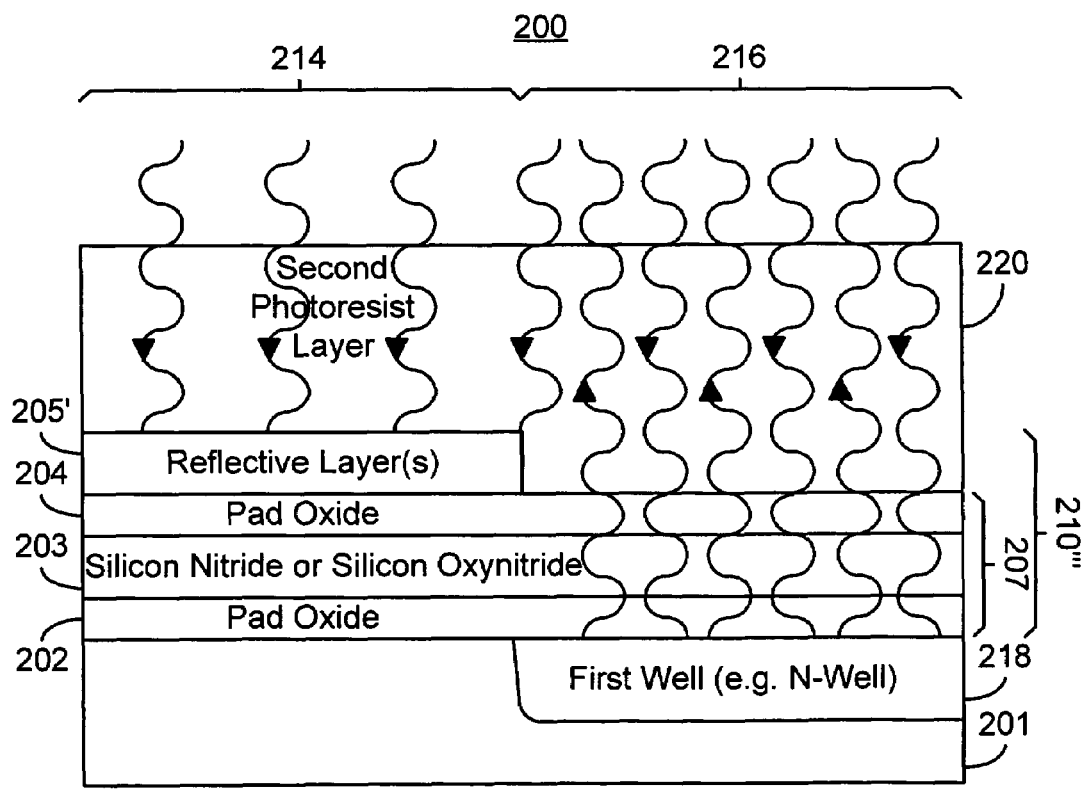

FIG. 12 depicts the semiconductor device 200 while step 170 is being performed. As can be seen in FIG. 12, light reflected from below the interference layer 210'''' causes destructive interference with the incident light. Thus, light reflected from the bottom of the blanket interference layer(s) 207 is one hundred eighty degrees out of phase from the light incident on the top of the blanket interference layer(s) 207. In a preferred embodiment, the total thickness of the blanket interference layers 207(s) (the thickness of the pad oxides 202 and 204 plus the thickness of the silicon nitride or silicon oxynitride layer 203) provides a path difference of one-half the characteristic wavelength of the light, which corresponds to a one hundred and eighty degree phase shift. Thus, the blanket interference layer(s) 207 may have a total thickness of substantially one-fourth a wavelength. Because the light reflecting from the bottom of the blanket interference layer(s) 207 traverses the layer(s) 207 twice, the light reflected from the bottom of the blanket interference layer(s) travels one-half a wavelength further than light incident on the top of the blanket interference layer(s). Consequently, destructive interference in the second portion 216 of the semiconductor device 200 may be achieved. In addition, in a preferred embodiment, the reflectivity of the blanket interference layer(s) 207 is low and the reflectivity of the layer below the blanket interference layer(s) 207 (here, the substrate 201) is high in comparison to the reflectivity of the blanket interference layer(s) 207. Consequently, the light incident on the blanket interference layer(s) 207 and the light reflected from the bottom interface of the blanket interference layer(s) 207 may be considered to be the only light traversing the second photoresist layer 220. However, in another embodiment, other light, such as the light reflected from the top of the blanket interference layer(s) 207 may be considered. In such an embodiment, the blanket interference layer(s) 207 may have another thickness to provide the appropriate phase shift for destructive interference in the second region 216 of the semiconductor device 200. Thus, the portion of the second photoresist layer 220 on the second portion 216 of the semiconductor device 200 is not developed. In contrast, the portion of the second photoresist layer 220 on the first portion 214 is developed.

Figure 13:
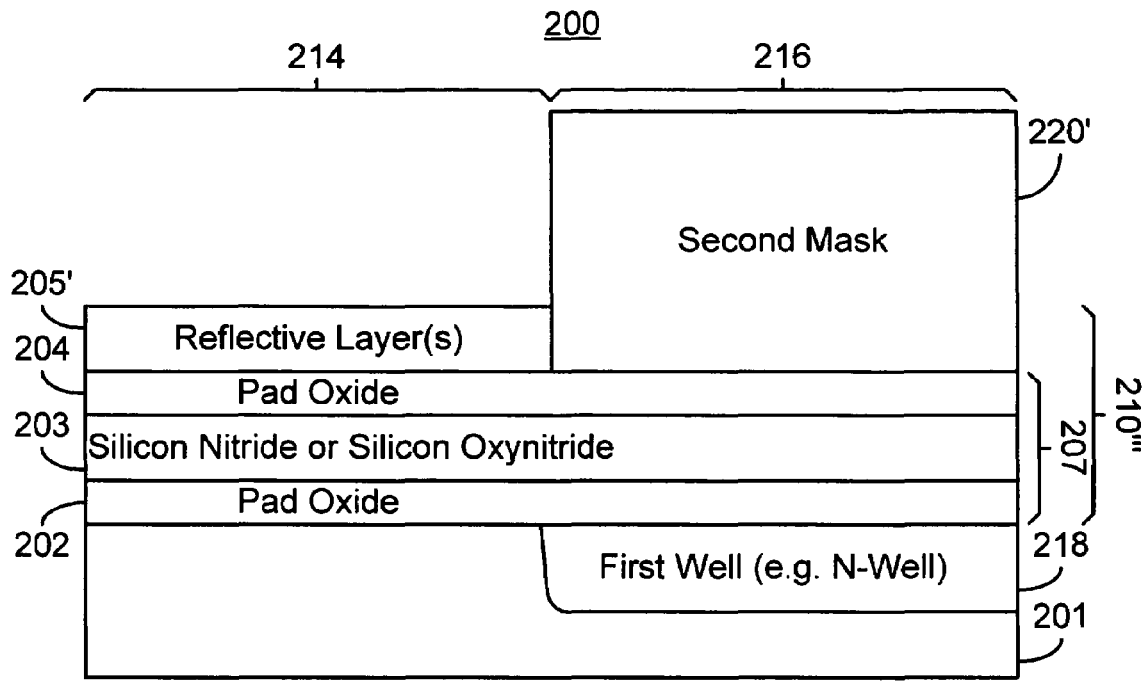

Furthermore, the presence of the reflective layer 205' on the first portion 214 of the semiconductor device 200 preferably strongly reflects light without the light undergoing a one hundred and eighty degree phase change. Thus, the dose of light absorbed by the second photoresist layer 220 is increased. Consequently, the efficiency of the blanket exposure in step 170 is improved. Step 170 also includes removing the developed portion of the photoresist layer 220 on the first portion 214 of the semiconductor device 200. FIG. 13 depicts the semiconductor device 200 after step 170 is completed. Thus, the second mask 220' remains. The second mask 220' substantially covers the second portion 216 of the semiconductor device 200, but substantially exposes the first portion 214 of the semiconductor device 200.

Figure 14:
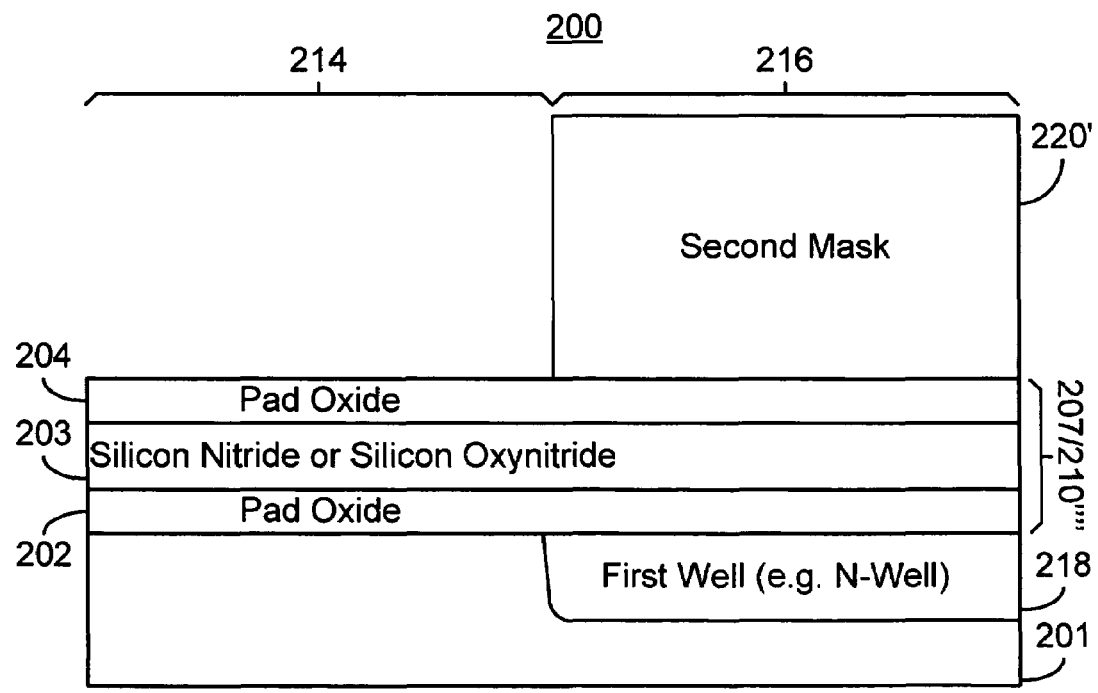

The remaining portion of the reflective layer(s) 205' in the first portion 214 of the semiconductor device 200 is removed, via step 172. FIG. 14 depicts the semiconductor device 200 after step 172 is completed. As can be seen in FIG. 14, the remaining portion of the reflective layer(s) 205' has been removed, leaving the interference layer(s) 210"" that are coextensive with the blanket interference layer(s) 207. Consequently, the surface of the blanket interference layer(s) 207 in the first portion 214 is uncovered.

Figure 15:
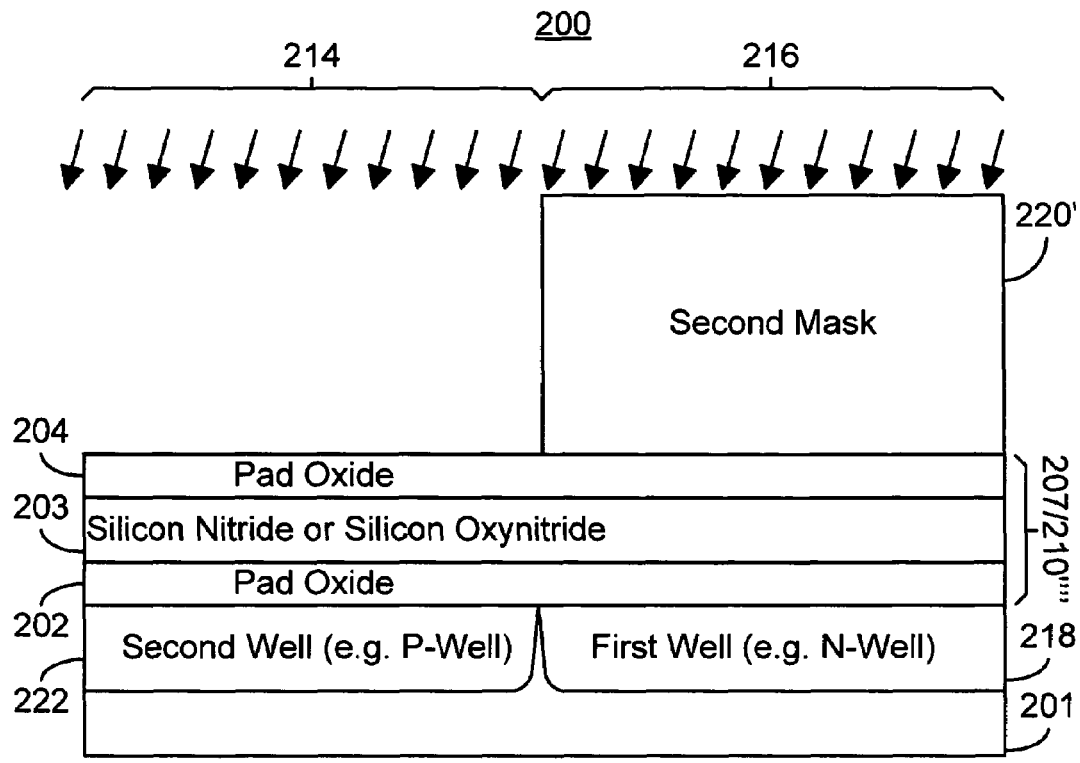
Figure 16:
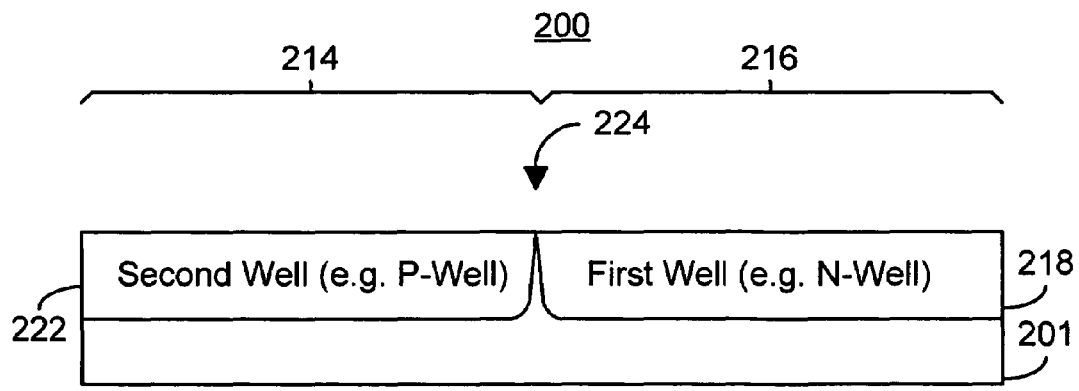

A second well is provided by implanting using a second dopant type that is different from the first dopant, via step 174. Because of the presence of the second mask 220', the second dopant does not penetrate the second portion 216 of the semiconductor device. Remaining structures, such as the reflective layer(s) 205', above the second well may be removed, for example using a blanket poly silicon etch. Processing may be completed. FIG. 15 depicts the semiconductor device 200 during the performance of step 174. Consequently, a second well 222 is being formed. Subsequent processing of the semiconductor device 200 can then be performed. For example, the second mask 220' may be stripped and other structure(s) formed. FIG. 16 depicts the semiconductor device after the formation of the second well 222 is complete. In addition, in the embodiment shown, the blanket interference layer(s) 207 have been stripped. Note, however, that in another embodiment one or more of the layers in the blanket interference layer(s) 207 may remain. In FIG. 16, the surface 224 of the semiconductor device 200 is identified. As can be seen in FIG. 16 the surface 224 is substantially planar. Stated differently, the surfaces of the first well 218 and the second well 222 for the twin well are substantially coplanar, without steps.

Using the method 150 a self-aligned twin well device is formed. Stated differently, the first well 218 and the second well 222 are adjacent and self aligned. This is achieved by aligning masks through the use of the interference layer. Consequently, subsequent processing is greatly facilitated. This is achieved relatively simply, without requiring expensive additional masks and processing steps.

A method and system for providing a twin-well semiconductor device has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A method for providing a twin well in a semiconductor device comprising:

providing at least one interference layer;

providing a first mask covering a first portion of the semiconductor device and uncovering a second portion of the semiconductor device;

implanting a first well in the second portion of the semiconductor device after the first mask is provided;

providing a second mask, then at least one interference layer being configured such that energy during a blanket exposure develops the second mask such that the second mask uncovers the first portion of the semiconductor device and covers the second portion of the semiconductor device; and implanting a second well in the first portion of the semiconductor device after the second mask is provided.

2. The method of claim 1 further comprising:

removing the first mask after the first well is implanted.

3. The method of claim 1, wherein providing at least one interference layer further includes:

providing at least one blanket interference layer on the first portion and the second portion of the semiconductor device; and providing a bottom anti-reflective coating layer.

4. The method of claim 3, wherein providing the first mask further includes:

providing a photoresist layer on the bottom anti-reflective coating layer, the bottom anti-reflective coating layer residing between the photoresist layer and the at least one blanket interference layer; and developing a portion of the photoresist layer on the second portion of the semiconductor device such that the portion of the photoresist layer may be removed and the first mask remains.

5. The method of claim 3, wherein the at least one interference layer includes providing a reflective layer between the at least one blanket interference layer and the bottom anti-reflective coating layer, and wherein the method further includes:

removing a portion of the reflective layer in the second portion of the semiconductor device.

6. The method of claim 5, wherein the first well implanting is formed after the removing the portion of the reflective layer is completed.

7. The method of claim 3, wherein the second mask providing further includes:

removing any portion of the bottom anti-reflective coating layer on the first portion of the semiconductor device.

8. The method of claim 7, wherein providing the second mask further includes:

providing a photoresist layer on the semiconductor device, the photoresist having a thickness such that the photoresist layer is sensitive to light having at least one wavelength; and developing a portion of the photoresist layer on the first portion of the semiconductor device such that the portion of the photoresist layer may be removed and only the second mask remains, the at least one blanket interference layer substantially eliminating energy from the light in the second portion of the semiconductor device.

9. The method of claim 8, wherein the interference layer providing further includes:

providing at least one reflective layer between the at least one blanket interference layer and the bottom anti-reflective coating layer on the first portion of the semiconductor device.

10. The method of claim 9, wherein the at least one reflective layer providing further includes:

forming a blanket reflective layer; and removing a portion of the blanket reflective layer on the second portion of the semiconductor device to provide the reflective layer prior to developing the photoresist layer.

11. The method of claim 10, wherein the at least one blanket interference layer is configured such that the light undergoes destructive interference in the photoresist layer on the second portion of the semiconductor device and reflected from the at least one reflective layer.

12. The method of claim 10, wherein the developing the photoresist layer further includes:
providing an open-frame exposure of the semiconductor device.

13. The method of claim 10, wherein the at least one blanket interference layer has a thickness and the light is characterized by a wavelength, the thickness of the at least one blanket interference layer being one-fourth the wavelength.

14. The method of claim 10, wherein the at least one blanket interference layer further includes a first pad oxide layer, a second pad oxide layer, and an intermediate layer, the intermediate layer including at least one of silicon nitride and silicon oxynitride.

15. The method of claim 10, wherein the at least one blanket interference layer further includes at least one of a pad oxide layer, a silicon nitride layer and a silicon oxynitride layer.

16. The method of claim 2, wherein the at least one blanket interference layer further includes a first pad oxide layer, a second pad oxide layer, and an intermediate layer, the intermediate layer including at least one of silicon nitride and silicon oxynitride.

17. A method for providing a twin well in a semiconductor device comprising:
providing at least one blanket interference layer on the semiconductor device;
providing at least one reflective layer on the at least one blanket interference layer;
providing a BARC on the at least one reflective layer;
providing a first photoresist layer on the BARC;
forming a first mask from the first photoresist layer, the first mask covering a first portion of the semiconductor device and uncovering a second portion of the device;
removing a portion of the BARC on the second portion of the semiconductor device;
removing a portion of the at least one reflective layer on the second portion of the semiconductor device;
implanting a first well, the first mask being configured such that the first well resides in the second portion of the semiconductor device;
removing the first mask
removing a remaining portion of the BARC on the first portion of the semiconductor device;
providing a second photoresist layer;
providing a blanket exposure of light on the semiconductor device, wherein the at least one blanket interference layer and a remaining portion of the at least one reflective layer are configured such that the light undergoes destructive interference in the portion of the second photoresist layer in the second portion of the semiconductor device but not in the portion of the second photoresist layer in the first portion of the semiconductor device;
removing a remaining portion of the at least one reflective layer on the first portion of the semiconductor device; and
implanting a second well in the first portion of the semiconductor device.

18. A method of forming a semiconductor device comprising:
depositing one or more interference layers including a reflective layer on a substrate;
forming a first mask using a first photoresist layer, the first mask covering a first portion of the semiconductor device and uncovering a second portion of the semiconductor device;
removing the portion of the reflective layer disposed in the second portion of the semiconductor;
implanting a first well in the second portion of the semiconductor device using the first mask;
removing the first mask and exposing a reflective layer disposed below the first mask;
providing blanket exposure of light on the semiconductor device;
reflecting a portion of the exposed light using the reflective layer disposed in the first portion of the semiconductor device to form a second mask on the second portion of the semiconductor device, the second mask uncovering the first portion of the semiconductor device and covering the second portion of the semiconductor device;
removing the reflective layer; and
implanting a second well in the first portion of the semiconductor device after the second mask is formed, wherein the second well having a co-planar surface with the first-well.

19. The method of claim 18, wherein the one or more interference layers further include at least one of a pad oxide layer, a silicon nitride layer and a silicon oxynitride layer.

* * * * *